United States Patent
Straubinger et al.

(10) Patent No.: US 8,747,982 B2
(45) Date of Patent: Jun. 10, 2014

(54) PRODUCTION METHOD FOR AN SIC VOLUME MONOCRYSTAL WITH A HOMOGENEOUS LATTICE PLANE COURSE AND A MONOCRYSTALLINE SIC SUBSTRATE WITH A HOMOGENEOUS LATTICE PLANE COURSE

(75) Inventors: Thomas Straubinger, Möhrendorf (DE); Michael Vogel, Nürnberg (DE); Andreas Wohlfart, Erlangen (DE)

(73) Assignee: SiCrystal Aktiengesellschaft, Nuremberg (DE)

( * ) Notice: Subject to any disclaimer, the term of this patent is extended or adjusted under 35 U.S.C. 154(b) by 0 days.

(21) Appl. No.: 13/338,694

(22) Filed: Dec. 28, 2011

(65) Prior Publication Data
US 2013/0171402 A1 Jul. 4, 2013

(51) Int. Cl.
*C30B 23/02* (2006.01)
*C30B 25/02* (2006.01)

(52) U.S. Cl.
CPC ................. *C30B 23/02* (2013.01); *C30B 25/02* (2013.01)
USPC ................. 428/64.1; 117/9; 117/84; 117/951

(58) Field of Classification Search
CPC ....................................................... C30B 23/02
USPC ................................. 428/64.1; 117/9, 84, 951
See application file for complete search history.

(56) References Cited

U.S. PATENT DOCUMENTS

| 6,773,505 B2 | 8/2004 | Kuhn et al. |
| 2004/0099205 A1* | 5/2004 | Li et al. ............................ 117/2 |

FOREIGN PATENT DOCUMENTS

| DE | 199 31 332 C2 | 6/2002 |
| DE | 19931332 C2 | 6/2002 |

* cited by examiner

*Primary Examiner* — Elizabeth Mulvaney
(74) *Attorney, Agent, or Firm* — Laurence A. Greenberg; Werner H. Stemer; Ralph E. Locher

(57) ABSTRACT

A method is used for producing an SiC volume monocrystal by sublimation growth. Before the beginning of growth, an SiC seed crystal is arranged in a crystal growth region of a growth crucible and powdery SiC source material is introduced into an SiC storage region of the growth crucible. During the growth, by sublimation of the powdery SiC source material and by transport of the sublimated gaseous components into the crystal growth region, an SiC growth gas phase is produced there. The SiC volume monocrystal having a central center longitudinal axis grows by deposition from the SiC growth gas phase on the SiC seed crystal. The SiC seed crystal is heated substantially without bending during a heating phase before the beginning of growth, so that an SiC crystal structure with a substantially homogeneous course of lattice planes is provided in the SiC seed crystal.

27 Claims, 5 Drawing Sheets

PRODUCTION METHOD FOR AN SIC VOLUME MONOCRYSTAL WITH A HOMOGENEOUS LATTICE PLANE COURSE AND A MONOCRYSTALLINE SIC SUBSTRATE WITH A HOMOGENEOUS LATTICE PLANE COURSE

BACKGROUND OF THE INVENTION

1. Field of the Invention

The invention relates to a method for producing an SiC volume mono-crystal and to a monocrystalline SiC substrate.

2. Background of the Invention

The semiconductor material silicon carbide (SiC) is used for high frequency components and for special light-providing semiconductor components because of its excellent physical, chemical, electrical and optical properties, inter alia also as a starting material for power-electronic semiconductor components. SiC substrates (=SiC wafers) with as large a substrate diameter as possible and as high a quality as possible are required for these components.

The basis of the SiC substrates are high-grade SiC volume monocrystals, which are generally produced by physical gas phase deposition, in particular by a sublimation method described, for example, in U.S. Pat. No. 6,773,505 B2 and in German patent DE 199 31 332 C2. The disc-shaped monocrystalline SiC substrates are cut out of these SiC volume monocrystals and are then provided during the manufacture of the components with at least one epitaxy layer in particular also consisting of SiC. The quality of this epitaxy layer decisively depends on the local orientation of the monocrystalline substrate, in other words of the SiC substrate. If local deviations from the optimal orientation occur in the crystal structure of the SiC substrate, this may propagate into the epitaxy layer. The epitaxy layer then also contains local defects, which ultimately can lead to poor properties of the end products, in other words the semiconductor components.

SUMMARY OF THE INVENTION

It is accordingly an object of the invention to provide an SiC volume monocrystal with a homogeneous lattice plane course and a monocrystalline SiC substrate with a homogeneous lattice plane course which overcomes the above-mentioned disadvantages of the prior art devices and methods of this general type, such that improved suitability is provided for the component production.

To achieve the object relating to the method, a method is disclosed, in which an SiC seed crystal is arranged before the beginning of growth in a crystal growth region of a growth crucible, which is preferably completely closed, in particular at least during the growth. Powdery SiC source material is introduced into an SiC storage region of the growth crucible. During the growth, by sublimation of the powdery SiC source material and by transport of the sublimated gaseous components into the crystal growth region, an SiC growth gas phase is produced there, and the SiC volume monocrystal having a central center longitudinal axis grows by deposition from the SiC growth gas phase on the SiC seed crystal. The SiC seed crystal is heated substantially without bending during a heating phase before the beginning of growth, so that an SiC crystal structure with a substantially homogeneous course of lattice planes is provided in the SiC seed crystal, wherein the lattice planes at each point have an angle of inclination relative to the direction of the center longitudinal axis, and peripheral angles of inclination differ at a radial edge of the SiC seed crystal in terms of amount by less than 0.05° from a central angle of inclination at the site of the central center longitudinal axis. The SiC crystal structure with the substantially homogeneous lattice plane course is propagated during the growth of the SiC seed crystal into the growing SiC volume monocrystal.

An SiC volume monocrystal, which has a high degree of homogeneity in its SiC crystal structure, is produced by the method according to the invention. The SiC crystal structure has certain lattice planes, which are determined by the spatial, in particular periodically repeating, arrangement of the atoms and which run, in particular in a very level manner, preferably substantially unbent or uncurved, in an SiC volume monocrystal produced according to the invention. To this extent, the course of the lattice planes is very homogeneous. Strictly speaking, with a non-level course, one would have to refer to "lattice faces" instead of "lattice planes". The mentioned non-level course is to be included here, however, under the term "lattice planes". The lattice planes, at the radial edge of the SiC volume monocrystal, preferably have practically the same orientation as in the center thereof. Direction details relate here, in each case, to the central center longitudinal axis of the SiC volume monocrystal. A direction parallel to or along the center longitudinal axis is thus designated "axial", a direction perpendicular thereto is designated "radial" and a peripheral direction running round the center longitudinal axis is designated "tangential". The orientation of the lattice planes deviates at the radial edge (=edge orientation) in particular by an amount of less than 0.05° from the orientation of the lattice planes in the center (=center orientation.

It was recognized that to produce high-grade SiC volume monocrystals with a lattice place course that is as homogeneous as possible it is particularly favorable to already take suitable measures during the heating phase, in other words still before the beginning of the actual growth process. In particular, care is taken during the heating process that the SiC seed crystal does not substantially bend, but its preferably level disc geometry is practically retained. On reaching the growth temperature of more than 2000° C., substantially the same conditions are present within the SiC crystal structure as at the room temperature before the heating process. An SiC seed crystal which, at room temperature, in particular has an SiC crystal structure with a level course of the lattice planes, then also provides an approximately homogeneous or level lattice plane orientation and therefore practically ideal conditions for the growth of an SiC volume monocrystal with a virtually perfect SiC crystal structure directly before the beginning of the actual sublimation growth at its growth boundary surface, onto which the SiC volume monocrystal grows. The homogeneous or level lattice plane orientation is preferably passed on or handed down from the SiC seed crystal into the growing SiC volume monocrystal.

Overall, with the growth method according to the invention, SiC volume monocrystals can thus be produced, from which SiC substrates with a very homogeneous lattice plane course can be obtained. Such SiC substrates with a very high precision in their SiC crystal structure offer virtually ideal conditions for the epitaxy process to be carried out in the framework of the component production. SiC volume monocrystals produced according to the invention can thus be used further very efficiently, in particular to produce semiconductor components.

A configuration is favorable in which the SiC seed crystal, before the beginning of growth, is rigidly, but detachably, connected to an in particular disc-shaped seed holder to form a holder-seed unit, and the holder-seed unit with a downwardly directed growth boundary surface of the SiC seed crystal in the region of an upper crucible end wall of the growth crucible is inserted loosely into the growth crucible in such a way that an, in particular, closed first cavity located within a wall structure of the growth crucible is formed between a rear side of the seed holder remote from the SiC seed crystal and the upper crucible end wall. In this case, a seed diameter of the SiC seed crystal is greater by a factor of at least 2000 than an in particular substantially uniform axial cavity dimension of the first cavity. Furthermore, an axial holder dimension with a value in the range between 0.5 mm and 1.5 mm is provided for the seed holder. Moreover, an axial seed dimension with a value in the range between 0.5 mm and 1.0 mm is provided for the SiC seed crystal. A dimension or extent perpendicular to the center longitudinal axis, in other words in the radial direction, is designated here the seed diameter. The axial cavity dimension is an extent of the first cavity in the direction of the center longitudinal axis, in particular a cavity length or depth. The axial holder dimension is, in particular, the holder thickness and the axial seed dimension, in particular, the seed thickness. The rigid connection provided in the framework of the holder-seed unit between the SiC seed crystal and the seed holder is favorable, as, in this manner, hollow channels are prevented from growing from the rear side of the SiC seed crystal along the axial temperature gradient prevailing in the growth crucible into the SiC seed crystal, whereby otherwise the quality of the growing SiC volume monocrystal could be reduced. The seed holder rigidly attached to the rear side of the SiC seed crystal is to this extent used as a barrier to the first cavity, from where the hollow channels could grow into the SiC seed crystal without this barrier function. Moreover, the seed holder in conjunction with the cavity located behind it means that the growth crucible, in the event of a temperature-induced expansion, does not exert a tensile or pressing force on the SiC seed crystal either directly or indirectly, for example during the heating to the growth temperature of over 2000° C. The cavity is, on the one hand, large enough to provide the holder-seed unit with some play and to substantially avoid the force effects of the growth crucible from behind due to the heat expansion but, on the other hand, is also small enough to prevent bending of the holder-seed unit, for example because of different heat expansion behavior of the seed holder and the SiC seed crystal. Moreover, the holder thickness is, in particular dimensioned to be so small that the lateral or radial tensile or pressing forces, which are produced by the heat expansion of the seed holder, are also not sufficient to break the SiC seed crystal. Thus, graphite, which can be used as a holder material, for example, expands more than SiC. Therefore, the seed holder should not be too thick so as not to mechanically damage the SiC seed crystal.

According to a further favorable configuration, a radial expansion into a region between a side (tangential) limiting face of the seed holder and a (tangential) crucible side wall is provided for the first cavity. The first cavity expands laterally, in other words in the radial direction, further than the seed holder. The first cavity has a larger diameter than the seed holder. As a result, no lateral forces originating from the crucible side wall act on the seed holder on the side peripheral edge thereof, which lateral forces could otherwise cause an undesired bending of the seed holder and the SiC seed crystal provided thereon if the material of the crucible side wall has a (slightly) smaller coefficient of heat expansion than the material of the seed holder.

According to a further favorable configuration, a second cavity, which is preferably open toward the crystal growth region, is formed between a side limiting face (=peripheral edge) of the SiC seed crystal and a crucible side wall. However, it may also be closed. A further cavity is, in particular, a free gap running tangentially around the SiC seed crystal. As a result, no lateral forces originating from the crucible side wall, which could otherwise cause an undesired bending of the SiC seed crystal, act on the SiC seed crystal on the side peripheral edge thereof. Moreover, an exact fitting of the SiC seed crystal in the inner region of the crucible laterally surrounded by the crucible side wall is only possible with substantial outlay. If the attempt at exact fitting were to fail and only a very thin gap were to remain between the crucible side wall and the side peripheral edge of the SiC seed crystal, this very thin gap would have an unfavorable effect on the local thermal field at this point. It is therefore more advantageous to provide from the start a further cavity running tangentially around the SiC seed crystal with an in particular then defined larger cavity or gap width, for example in the range between about 2 mm and about 6 mm.

According to a further favorable configuration, a seed diameter with a value, which is smaller than a holder diameter of the seed holder, is provided for the SiC seed crystal. Dimensions perpendicular to the center longitudinal axis, in other words in the radial direction, are in each case designated diameters here. The SiC seed crystal is preferably placed concentrically with respect to the center longitudinal axis on the seed holder. In this configuration, the holder-seed unit can particularly easily be placed loosely with the edge region of the seed holder projecting laterally over the SiC seed crystal, for example, into a side crucible wall recess so that, on the one hand, the desired holding function is provided and, on the other hand, no undesired forces act from the growth crucible on the holder-seed unit.

According to a further favorable configuration, a seed diameter with a value which is smaller than a smallest growth region diameter of the crystal growth region, is provided for the SiC seed crystal. The seed diameter, at least in the region of the upper crucible end wall of the growth crucible, in which the holder-seed unit is inserted, is preferably smaller than a growth region diameter provided there. The SiC seed crystal then does not lie laterally, i.e. with its peripheral edge, on the inside of the crucible side wall, so that no undesired forces can act on it from there. This contributes to preventing bending of the SiC seed crystal.

According to a further favorable configuration, a value, which is greater than a smallest growth region diameter of the crystal growth region, is provided for the seed diameter. Moreover, the holder-seed unit rests exclusively with the seed holder on a crucible side wall, in particular in a preferably stepped recess of the crucible side wall. In this configuration, the SiC seed crystal also does not rest laterally, i.e. with its peripheral edge, on the inside of the crucible side wall, so that no undesired forces can act on it from there. This in turn contributes to preventing bending of the SiC seed crystal. On the other hand, the complete cross-sectional face of the crystal growth region is used for transport of the SiC gas species formed by the sublimation and also to the growth of the SiC volume monocrystal. Moreover, the second cavity formed between the side edge of the SiC seed crystal and the inside of the crucible side wall is shaded or covered in this configuration relative to the SiC storage region, so that no SiC gas species are supplied to the second cavity, in any case not to any significant extent. As a result, no polycrystalline SiC material is deposited in the second cavity, which could otherwise induce defects in the growing SiC volume monocrystal.

According to a further favorable configuration, a value, which is greater than a smallest growth region diameter of the crystal growth region, is provided for the seed diameter. Moreover, the holder-seed unit also rests with the SiC seed crystal on a crucible side wall, in particular in a preferably stepped recess of the crucible side wall. The resting of the SiC seed crystal on the crucible side wall is, in this case, in particular loose, so that radial relative movements between the SiC seed crystal and the crucible side wall are preferably possible, for example during the heating phase. During these relative movements, there is preferably no significant introduction of force into the SiC seed crystal. In this configuration, the complete cross sectional face of the crystal growth region during the actual growth phase is also used to transport the SiC gas species formed by the sublimation and for the growth of the SiC volume monocrystal. Furthermore, the shading of the second cavity formed between the side edge of the SiC seed crystal and the inside of the crucible side wall is particularly effective relative to the SiC storage region in this configuration. A depositing of polycrystalline (SiC material) in the second cavity can be practically ruled out here.

According to further favorable configuration, a value in the range between 100 mm and 115 mm, preferably of 110 mm, is provided for the seed diameter, a growth region diameter with a value in the range between 100 mm and 120 mm, preferably of 110 mm is provided for the crystal growth region, and a value of less than 50 μm is provided for the axial cavity dimension of the first cavity. A further configuration is favorable, in which a value in the range between 150 mm and 170 mm, preferably of 160 mm is provided for the seed diameter, a growth region diameter with a value in the range between 155 mm and 175 mm, preferably of 160 mm is provided for the crystal growth region, and a value of less than 75 μm is provided for the axial cavity dimension of the first cavity. A further configuration is favorable, in which a value in the range between 200 mm and 225 mm, preferably of 210 mm is provided for the seed diameter, a growth region diameter with a value in the range between 205 mm and 230 mm, preferably of 210 mm, is provided for the crystal growth region, and a value of less than 100 μm is provided for the axial cavity dimension of the first cavity. These particular favorable configurations are distinguished in each case by the fact that the dimensions of the SiC seed crystal, of the first cavity located axially behind the holder-seed unit and of the crystal growth region located axially in front of the holder-seed unit are matched to one another in such a way that during the heating phase, a bending that is as low as possible of the SiC seed crystal and, later during the actual growth phase, a growth of the SiC volume monocrystal results with a lattice plane course which is as homogeneous or level as possible.

According to a further favorable configuration, a holder material made of polycrystalline SiC is used for the seed holder. The coefficients of heat expansion of the two components of the holder-seed unit, in other words of the seed holder and the SiC seed crystal, are then very similar to one another, so the force effects caused by temperature of the seed holder on the SiC seed crystal are particularly small. However, another holder material is basically also possible, for example a graphite material.

To achieve the object relating to a monocrystalline SiC substrate, an SiC substrate with a substrate main surface, with a central center longitudinal axis oriented perpendicular to the substrate main surface, with a radial edge and with an SiC crystal structure having lattice planes, the lateral planes at each point having an angle of inclination relative to the direction of the center longitudinal axis, and peripheral angles of inclination differing in terms of amount at any desired point at the radial edge by less than 0.05° from a central angle of inclination at the site of the central center longitudinal axis.

The SiC substrate according to the invention has a very homogeneous or level course of the lattice planes. This homogeneous lattice plane course provides virtually ideal starting conditions for the epitaxy process to be carried out in the framework of the component production. A very high-grade, practically defect-free epitaxy layer can then be applied. The SiC substrate according to the invention is accordingly excellently suited for the efficient production of high-grade components with a very low reject rate. In comparison, in the component production using previous SiC substrates, a low yield and/or higher rejections are the result because of the non-ideal epitaxy conditions with at least local deviations from a uniform lattice plane orientation. To this extent, the SiC substrate according to the invention can be used particularly advantageously, in particular as a substrate for producing semiconductor components.

Monocrystalline SiC substrates with such a homogeneous lattice plane course did not previously exist. They can firstly be produced from SiC volume monocrystals, which have been produced according to the above-described method according to the invention or the configurations thereof, for example by successive and disc-wise cutting or sawing off of such SiC volume monocrystals. The substrate main surface of an SiC substrate of this type is, in this case, oriented in particular substantially perpendicular to the growth direction of the SiC volume monocrystal. The growth direction is parallel to the center longitudinal axis.

The SiC substrate according to the invention satisfies the industrial requirements with regard to use for the production of semiconductor components. A substrate thickness measured perpendicular to the substrate main surface of an SiC substrate of this type is, in particular in the range between about 100 μm and about 1000 μm and preferably in the range between about 250 μm and about 700 μm, the substrate thickness having a global thickness fluctuation viewed over the complete substrate main surface of preferably at most 20 μm. Furthermore, at least one of the two mutually opposing substrate main surfaces has a surface roughness of preferably at most 3 nm. The SiC substrate has a certain mechanical stability and is, in particular, self-supporting. It preferably has a substantially round disc shape, i.e. the substrate main surface is practically round. A slight deviation from the precisely circular geometry may optionally be present because of at least one identification marking provided on the peripheral edge.

A configuration is favorable, in which the substrate main surface has a substrate diameter of at least 100 mm, in particular of at least 150 mm, preferably of at least 200 mm, and most preferably of at least 250 mm. The larger the substrate diameter, the more efficiently the monocrystalline SiC substrate can be used further, for example to produce semiconductor components. The production costs therefore drop for the semiconductor components. An SiC substrate with a diameter that is so large can advantageously also be used to produce relatively large semiconductor components, which, for example, have a basic area of about 1cm$^2$.

Other features which are considered as characteristic for the invention are set forth in the appended claims.

Although the invention is illustrated and described herein as embodied in production method for an SiC volume monocrystal with a homogeneous lattice plane course and a monocrystalline SiC substrate with a homogeneous lattice plane course, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
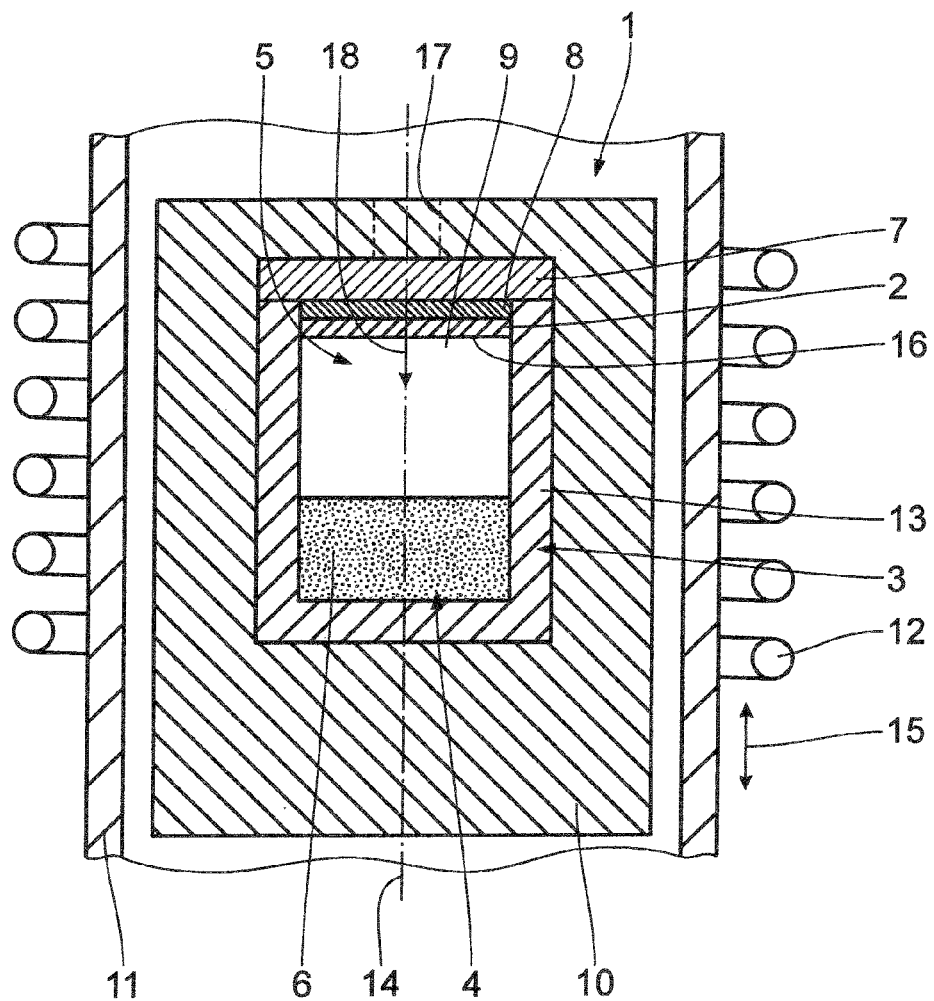
FIG. 1 is a diagrammatic, sectional view of an embodiment of a growth arrangement during a sublimation growth of an SiC volume monocrystal according to the invention.

Mutually corresponding parts are provided with the same reference numerals in FIGS. 1 to 6. Details of the embodiments described in more detail below can also be an invention per se or be part of an inventive subject.

Referring now to the figures of the drawing in detail and first, particularly, to FIG. 1 thereof, there is shown a growth arrangement 1 for producing an SiC volume monocrystal 2 by sublimation growth. The growth arrangement 1 contains a growth crucible 3, which contains an SiC storage region 4 and a crystal growth region 5. Located in the SiC storage region 4 is, for example, powdery SiC source material 6, which is introduced as prefabricated starting material before the beginning of the growth process into the SiC storage region 4 of the growth crucible 3.

A SiC seed crystal 8 extending axially into the crystal growth region 5 is provided in the region of a crucible end wall 7 of the growth crucible 3 opposing the SiC storage region 4. The SiC seed crystal is, in particular, monocrystalline. Its arrangement within the growth crucible 3 will be described in more detail below with the aid of the embodiments according to FIGS. 2 to 4. The crucible end wall 7 is configured as a crucible lid of the growth crucible 3 in the embodiment shown. This is not imperative, however. The SiC volume monocrystal 2 to be grown grows on the SiC seed crystal 8 by deposition from an SiC growth gas phase 9 forming in the crystal growth region 5. The growing SiC volume monocrystal 2 and the SiC seed crystal 8 have approximately the same diameter. If at all, there is a deviation of at most 10%, by which a seed diameter of the SiC seed crystal 8 is smaller than a monocrystal diameter of the SiC volume monocrystal 2. However, a gap, not shown in FIG. 1, may be present between the inside of a crucible side wall 13, on the one hand, and the growing SiC volume monocrystal 2 and the SiC seed crystal 8, on the other hand.

The growth crucible 3 including the crucible lid 7, in the embodiment according to FIG. 1, consists of an electrically and thermal conductive graphite crucible material with a density of, for example, at least 1.75 g/cm$^3$. Arranged around it is a thermal insulation layer 10. The latter consists, for example, of a foam-like graphite insulation material, the porosity of which is, in particular, significantly higher than that of the graphite crucible material.

The thermally insulated growth crucible 3 is placed inside a tubular container 11, which is designed as a quartz glass tube in the embodiment and forms an autoclave or reactor. To heat the growth crucible 3, an inductive heating device in the form of a heating coil 12 is arranged around the container 11. The growth crucible 3 is heated by the heating coil 12 to growth temperatures of more than 2000° C., in particular to about 2200° C. The heating coil 12 inductively couples an electric current into the electrically conductive crucible side wall 13 of the growth crucible 3. This electric current substantially flows as a circulating current in the peripheral direction within the circular and hollow cylindrical crucible side wall 13 and in the process heats the growth crucible 3. If necessary, the relative position between the heating coil 12 and the growth crucible 3 can be changed axially, i.e. in the direction of a center longitudinal axis 14 of the growing SiC volume monocrystal 2, in particular in order to adjust the temperature or the temperature course within the growth crucible 3 and optionally also to change it. The position of the heating coil 12 that can be axially changed during the growth process is indicated in FIG. 1 by the double arrow 15. In particular, the heating coil 12 is displaced, adapted to the growth progress of the growing SiC volume monocrystal 2. The displacement preferably takes place downwardly, in other words in the direction of the SiC source material 6, and preferably by the same length by which the SiC volume monocrystal 2 grows, for example in total by about 20 mm. For this purpose, the growth arrangement 1 contains correspondingly configured checking, control and adjustment means, not shown in more detail.

The SiC growth gas phase 9 in the crystal growth region 5 is fed by the SiC source material 6. The SiC growth gas phase 9 contains at least gas constituents in the form of Si, Si$_2$C and SiC$_2$ (=SiC gas species). The transport of the SiC source material 6 to a growth boundary surface 16 at the growing SiC volume monocrystal 2 takes place along an axial temperature gradient. An axial temperature gradient measured in the direction of the center longitudinal axis 14 of at least 5 K/cm, preferably of at least 10 K/cm, is adjusted, in particular, at the growth boundary surface 16. The temperature within the growth crucible 3 decreases toward the growing SiC volume monocrystal 2. This can be achieved by various measures. Thus, an axially varying heating can be provided by a division, not shown in more detail, of the heating coil 12 into two or more axial part portions. Furthermore, a stronger heating effect can be adjusted in the lower portion of the growth crucible 3, for example by a corresponding axial positioning of the heating coil 12, than in the upper portion of the growth crucible 3. Moreover, the heat insulation at the two axial crucible end walls may be different. As indicated schematically in FIG. 1, the thermal insulation layer 10 at the lower crucible end wall may, for this purpose, have a larger thickness than at the upper crucible end wall. Furthermore, it is possible for the thermal insulation layer 10 adjacent to the upper crucible end wall 7, to have a central cooling opening 17, through which heat is dissipated and which is arranged about the central longitudinal axis 14. This central cooling opening 17 is indicated in FIG. 1 by the dashed lines.

The SiC volume monocrystal 2 grows in a growth direction 18, which is oriented, in the embodiment shown in FIG. 1, from top to bottom, in other words from the crucible lid 7 to the SiC storage region 4. The growth direction 18 runs parallel to the central center longitudinal axis 14. As the growing SiC volume monocrystal 2 in the embodiment shown is arranged concentrically within the growth arrangement 1, the central center longitudinal axis 14 can also be allocated to the growth arrangement 1 as a whole.

Moreover, the SiC growth gas phase 9, in the view according to FIG. 1, also contains doping substances, which are not shown in more detail in the view according to FIG. 1, which are nitrogen ($N_2$) in the embodiment. Alternative or additional doping substances such as, in particular aluminum (Al), Vanadium (V) and/or boron (B) are also possible. The doping substance is supplied either in gaseous form or by the then accordingly pre-treated SiC source material 6. In the embodiment, the SiC volume monocrystal 2 has an n-doping with nitrogen. This is also 4H—SiC. However, another doping or another SiC polytype is also basically possible Further embodiments of growth arrangements 19, 20 and 21 for producing an SiC volume monocrystal 2 by sublimation growth are in each case shown in FIGS. 2 to 4 at a time before the actual beginning of growth. With respect to their structure, they substantially correspond to that of the growth arrangement 1 according to FIG. 1. Differences only exist with respect to the type and manner of the arrangement of the SiC seed crystal 8 in the region of the crucible end wall 7.

The SiC seed crystal 8 in each case forms, together with a seed holder 22, a holder-seed unit 23. The holder-seed unit 23 is produced by a rigid connection, which can, however, preferably be detached again, of the SiC seed crystal 8 to the seed holder 22. The SiC seed crystal 8 is in particular glued to the seed holder 22.

Figure 2:
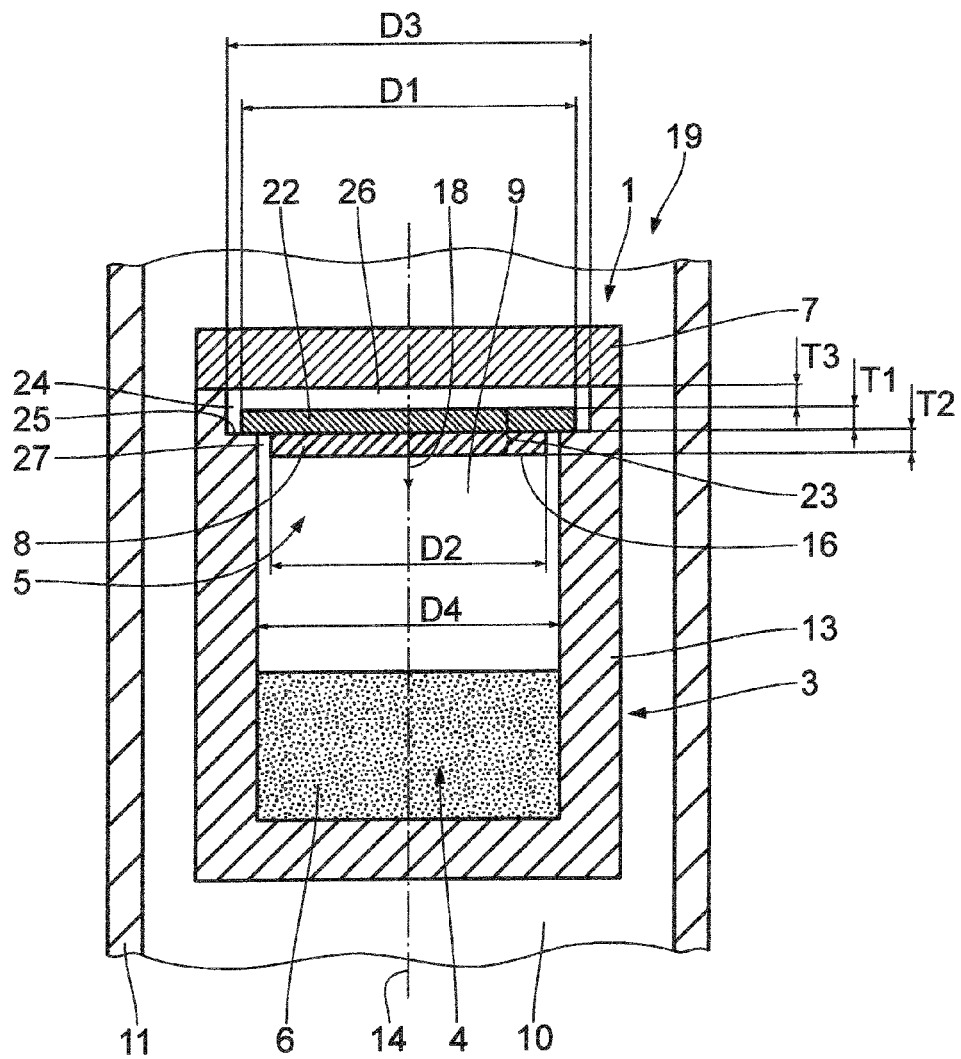
FIGS. 2 to 4 are diagrammatic, sectional views of further embodiments of the growth arrangements still before the sublimation growth of an SiC volume monocrystal.

In the growth arrangement 19 shown in FIG. 2, the holder-seed unit 23 is loosely inserted in a recess 24 on the inside of the crucible side wall 13. A holder diameter D1 of the seed holder 22 is greater than a seed diameter D2 of the SiC seed crystal 8, but smaller than a recess diameter D3 of the recess 24. The holder-seed unit 23 is placed with the edge region of the seed holder 22 projecting radially over the SiC seed crystal 8 on a recess side wall 25 of recess 24. The growth boundary surface 16 of the SiC seed crystal 8, on which the SiC volume monocrystal 2 not shown in FIG. 2 grows during the actual growth, is directed downwardly, into the crystal growth region 5 and toward the SiC storage region 4. The crystal growth region 5 in the embodiment according to FIG. 2 has a growth region diameter D4, which is greater, in particular by about 10 mm greater, than the seed diameter D2 of the SiC seed crystal 8.

Located between a rear side of the seed holder 22 remote from the SiC seed crystal 8 and the upper crucible end wall 7 is a cavity 26, which extends into the region between a side limiting face of the seed holder 22 and the crucible side wall 13 within the recess 24. The cavity 26 is therefore located behind the holder-seed unit 23 and within the wall structure of the growth crucible 3. A second cavity 27 in the form of a free annular gap running tangentially around the SiC seed crystal 8 is also formed between a side peripheral edge of the SiC seed crystal 8 and the inside of the crucible side wall 13. The cavity 27 is open toward the crystal growth region 5.

In the embodiment shown in FIG. 2, the seed holder 22 has a holder thickness T1 of about 1 mm, the SiC seed crystal 8 has a seed thickness T2 of about 0.7 mm and the cavity 26 has a cavity depth T3 of about 50 µm. The seed holder 22 consists of polycrystalline SiC. The coefficient of heat expansion of the seed holder 22 is therefore similar to that of the SiC seed crystal 8 consisting of monocrystalline SiC.

The conditions before the beginning of the heating phase are shown in FIG. 2. The SiC seed crystal and the seed holder 22 are located in their respective disc-like level starting state. The SiC seed crystal 8 has an SiC crystal structure with lattice planes, which extend homogeneously or in a level manner in the starting state according to FIG. 2. In particular, the lattice planes have substantially the same orientation in the center around the center longitudinal axis 14 as in the edge region of the SiC seed crystal 8 adjoining the side peripheral edge.

During the heating phase, the growth arrangement 1 is heated from room temperature to the operating temperature required for the sublimation growth of above 2000° C. In this case, the holder-seed unit 23 advantageously substantially retains its starting state shown in FIG. 2. In particular, no significant bending or curving of the SiC seed crystal 8 occurs, so that even on conclusion of the heating phase and directly before the beginning of the actual growth, it also has the favorable homogeneous or level lattice plane course. Deviations of the lattice plane orientation in the center from those in the edge region are, if present at all, smaller than 0.05° in terms of amount. On comparison of the central and the peripheral lattice plane orientations, the amount of angle difference is therefore in any case less than 0.05°.

During the heating phase, in the embodiment shown, bending of the SiC seed crystal 8 is prevented in particular because of the following measures: on the one hand because of the comparable coefficient of heat expansion of the SiC seed crystal 8 and the seed holder 22 and, on the other hand, also because of the narrow cavity 26, which is mainly arranged axially behind the holder-seed unit 23 but also extends radially into a region between the side limiting face of the seed holder 22 and the crucible side wall 13 and which is large enough, on the one hand, to prevent bending of the holder-seed unit 23 because of an action of force from the growth crucible 3 onto the holder-seed unit 23, and, on the other hand, is small enough to prevent bending of the holder-seed unit 23 by itself. The very homogeneous lattice plane course of the SiC seed crystal 8 therefore provided at the end of the heating phase is then also handed down into the SiC volume monocrystal 2, which, on conclusion of the heating phase during the actual sublimation growth process grows on the SiC seed crystal 8.

Moreover, the thickness ratio between the SiC seed crystal 8 and the seed holder 22 is preferably selected such that it meets various requirements. The SiC seed crystal 8 should, in particular, on the one hand, not be too thin, as it could otherwise evaporate, for example in its radial edge region during the heating phase and then no crystal lattice information would be available to hand down to the growing SiC volume monocrystal during the growth phase at these completely evaporated points. On the other hand, the SiC seed crystal 8 should, however, in particular also not be too thick, as it would otherwise use up too much expensive monocrystalline SiC material and would be very expensive. Furthermore, the seed holder 22 should, in particular, on the one hand, also not be too thin, as it would otherwise damage the SiC seed crystal 8 during the heating phase, for example by too strong an introduction of force or could even break it. On the other hand, the seed holder 22 should, in particular, however, also not be too thick, as it would otherwise lack, for example, the desired mechanical stability.

Figure 3:
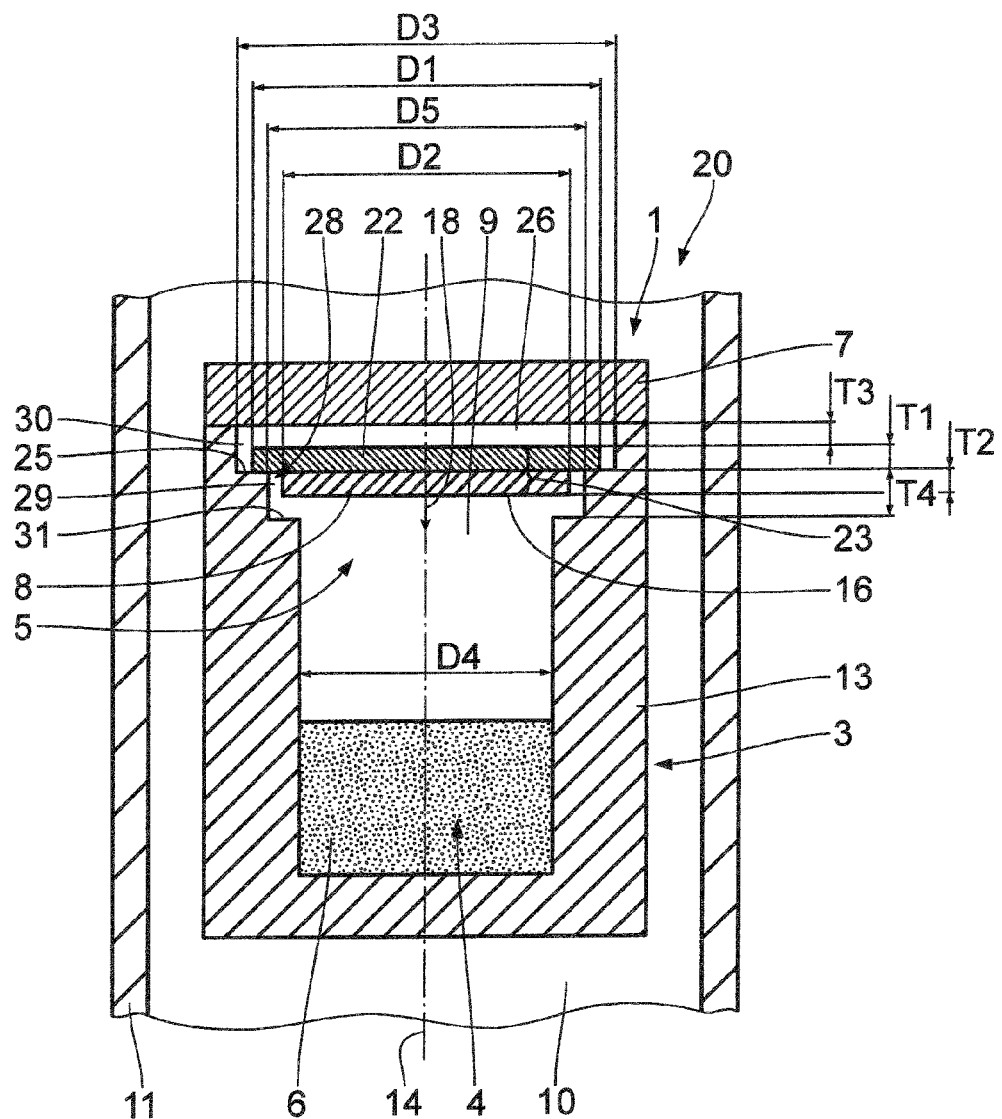

The growth arrangement 20 shown in FIG. 3 differs from the growth arrangement 19 according to FIG. 2 substantially only by the mounting of the holder-seed unit 23 in the crucible side wall 13. A stepped recess 28 with a first and a second step 29 or 30 is provided on the inside of the crucible side wall 13 in the growth arrangement 20. A step side wall of the second step 30 is, in this case, the recess side wall 25, on which the seed holder 22 in turn rests loosely. The first step 29 arranged before the second step 30 in the growth direction 18 has a first step diameter D5, which is smaller than the step diameter of the second step 30, which corresponds to the recess diameter D3 of the recess 24 of the growth arrangement 19 according to FIG. 2. The seed diameter D2 in this embodiment is larger than the growth region diameter D4, but smaller than the first step diameter D5. Moreover, the first step 29 has a step height T4, which is greater than the seed thickness T2. The SiC seed crystal 8 extends radially into the region of the first step 29, without, however, touching the crucible side wall 13 at the base of the first step 29 in the process. Because of the step height T4 which is greater than the seed thickness T2, the SiC seed crystal 8 also does not touch a step side wall 31 of the first step 29 with its growth boundary face 16. No direct introduction of force from the growth crucible 3 into the SiC seed crystal 8 therefore takes place for lack of direct contacting.

Figure 4:
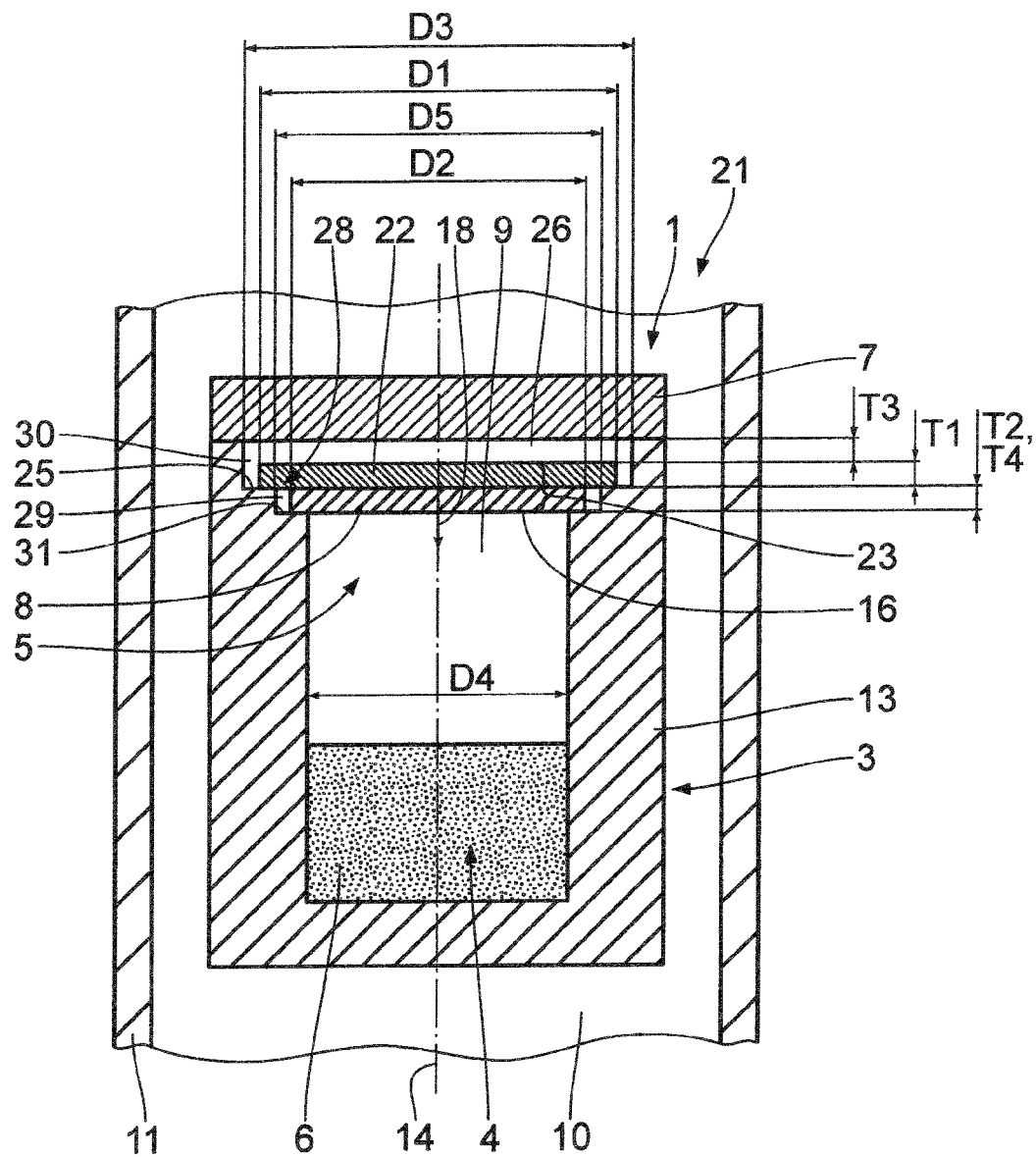

The growth arrangement 21 shown in FIG. 4 differs from the growth arrangement 20 according to FIG. 3 substantially only by the dimensioning of the step height T4 of the first step 29. In this embodiment, it is approximately the same size as the seed thickness T2, so the SiC seed crystal 8 in its radial edge region rests with its main surface remote from the seed holder 22 on the step side wall 31.

Figure 5:
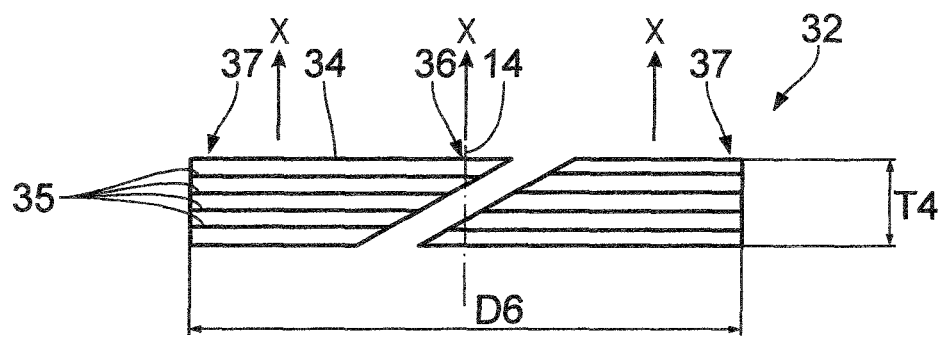
FIG. 5 is a diagrammatic, cross sectional view of an embodiment of a monocrystalline SiC substrate, which is produced from an SiC volume monocrystal grown by one of the growth arrangements according to FIGS. 1 to 4, with level lattice planes.
Figure 6:
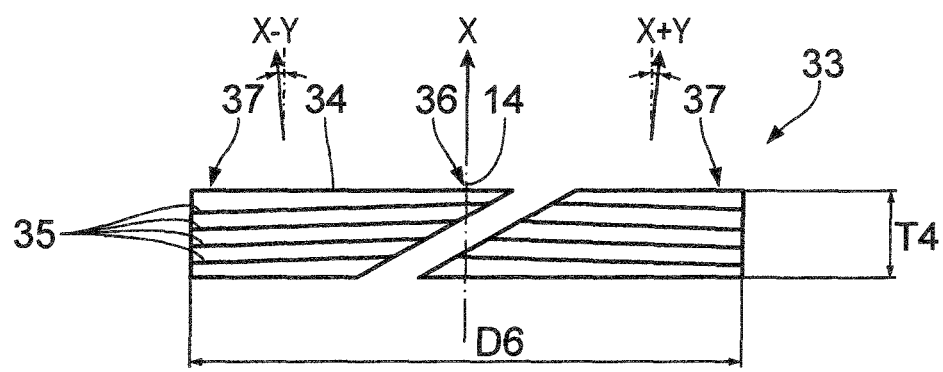
FIG. 6 is a diagrammatic, cross-section view of an embodiment of a monocrystalline SiC substrate, which is produced from an SiC volume monocrystal grown by one of the growth arrangements according to FIGS. 1 to 4, with slightly bent lattice planes.

An SiC volume monocrystal 2 produced by the growth arrangements 1, 19 to 21, with respect to its SiC crystal structure, substantially has the same homogeneous lattice plane course as the SiC seed crystal 8 at the end of the heating phase. The same applies to the disc-like SiC substrates 32, 33, which are produced from an SiC volume monocrystal 2 of this type. All the monocrystalline SiC substrates 32 and 33 of this type, of which embodiments are shown in a cross-sectional view in FIGS. 5 and 6, are obtained from the SiC volume monocrystal 2 in that they are cut off or sawn off axially successively as discs perpendicular to the growth direction 18 or to the center longitudinal axis 14. The SiC substrates 32, 33 are large and thin. In the embodiments shown, their substrate main surface 34 in each case has a substrate diameter D6 of 150 mm, whereas a substrate thickness T5 is about 500 μm.

In the view of the SiC substrates 32 and 33 shown in FIGS. 5 and 6, lattice planes 35 of the SiC crystal structure are also entered schematically in each case. The SiC substrates 32 and 33 in each case have front and rear faces which are arranged practically ideally parallel to one another and practically ideally level in each case, of which one is the substrate main surface 34. The lattice planes 35 in each case have the substantially homogeneous course already mentioned.

The lattice planes 35 run virtually absolutely in a level manner in the SiC substrate 32 formed in FIG. 5, the lattice plane orientations in the center 36 close to the center longitudinal axis 14 practically not deviating from those in the edge region 37. An angle of inclination measured relative to the direction of the center longitudinal axis 14 is the same size everywhere. In the embodiment shown in FIG. 5, the angle of inclination is approximately zero. The tilting of the substrate main surface 34 relative to one of the main planes or main directions of the SiC crystal lattice is designated X in FIGS. 5 and 6. X gives the deviation of the c-axis [001] of the SiC crystal lattice in the embodiment shown in FIG. 5. The tilting X may, in particular adopt values between 0° and 10°, preferably between 0° and 5°. A value of 4° is typical.

In the SiC substrate 33 depicted in FIG. 6, the lattice planes 35 still run very homogeneously but not in an absolutely level manner. In the embodiment shown, the lattice planes 35 in the center 36 run practically perpendicular to the center longitudinal axis 14. The central angle of inclination is approximately zero. In the edge region 37, the lattice planes 35 have a peripheral angle of inclination different from zero. The amount of the peripheral angles of inclination which are measured relative to the direction of the center longitudinal axis 14 and are symbolized in FIG. 6 by ±Y, is less than 0.05°, typically 0.04°.

The SiC substrates 32 and 33 according to FIGS. 5 and 6 are distinguished by a very homogeneous lattice plane course. The practically ideally level lattice planes 35 form a virtually perfect starting basis for the monocrystalline SiC epitaxy layer to be applied. To this extent, the SiC substrates 32 and 33 are very suitable for the component production.

The invention claimed is:

1. A method for producing an SiC volume monocrystal by sublimation growth, which comprises the steps of:
    disposing an SiC seed crystal in a crystal growth region of a growth crucible before a beginning of a growth process;
    introducing a powdery SiC source material into an SiC storage region of the growth crucible;
    producing an SiC growth gas phase during the growth process by means of sublimation of the powdery SiC source material and by of transport of sublimated gaseous components into the crystal growth region, and the SiC volume monocrystal having a central center longitudinal axis grows by means of deposition from the SiC growth gas phase on the SiC seed crystal;
    substantially heating the SiC seed crystal without bending during a heating phase before the beginning of the growth process, so that an SiC crystal structure with a substantially homogeneous course of lattice planes is provided in the SiC seed crystal, wherein the lattice planes have an angle of inclination at every point relative to a direction of the center longitudinal axis, and peripheral angles of inclination at a radial edge of the SiC seed crystal differ with respect to amount by less than 0.05° from a central angle of inclination at a site of the central center longitudinal axis; and
    propagating the SiC crystal structure with the substantially homogeneous course of lattice planes during the growth process of the SiC seed crystal into the growing SiC volume monocrystal.

2. The method according to claim 1, which further comprises:
    connecting the SiC seed crystal, before a start of the growth process, rigidly, detachably, to a seed holder to form a holder-seed unit, and the holder-seed unit with a downwardly directed growth boundary surface of the SiC seed crystal in a region of an upper crucible end wall of the growth crucible is loosely placed in the growth crystal such that a first cavity located within a wall structure of the growth crucible is formed between a rear side of the seed holder remote from the SiC seed crystal and the upper crucible end wall, and a seed diameter of the SiC seed crystal being greater by at least a factor of 2000 than an axial cavity dimension of the first cavity;
    providing the seed holder with an axial holder dimension with a value in a range between 0.5 mm and 1.5 mm; and
    providing the SiC seed crystal with an axial seed dimension with a value in a range between 0.5 mm and 1.0 mm.

3. The method according to claim 2, wherein a radial extent into a region between a side limiting face of the seed holder and a crucible side wall is provided for the first cavity.

4. The method according to claim 1, which further comprises forming a second cavity between a side limiting face of the SiC seed crystal and a crucible side wall.

5. The method according to claim 2, which further comprises providing the SiC seed crystal with a seed diameter having a value, which is smaller than a holder diameter of the seed holder.

6. The method according to claim 1, which further comprises providing the SiC seed crystal with a seed diameter having a value, which is smaller than a smallest growth region diameter of the crystal growth region.

7. The method according to claim 2, which further comprises providing the seed diameter with a value, which is larger than a smallest growth region diameter of the crystal growth region, and the holder-seed unit rests exclusively with the seed holder on a crucible side wall.

8. The method according to claim 2, which further comprises providing the seed diameter with a value, which is larger than a smallest growth region diameter of the crystal growth region, and the holder-seed unit rests exclusively with the seed holder in a recess of a crucible side wall.

9. The method according to claim 8, which further comprises forming the recess as a stepped recess.

10. The method according to claim 2, which further comprises providing the seed diameter with a value, which is larger than a smallest growth region diameter of the crystal growth region, and the holder-seed unit also rests with the SiC seed crystal on a crucible side wall.

11. The method according to claim 2, which further comprises providing the seed diameter with a value, which is larger than a smallest growth region diameter of the crystal growth region, and the holder-seed unit also rests with the SiC seed crystal in a recess of the crucible side wall.

12. The method according to claim 11, which further comprises forming the recess as a stepped recess.

13. The method according to claim 2, which further comprises:
providing the seed diameter with a value in a range between 100 mm and 115 mm;
providing the crystal growth region with a growth region diameter having a value in a range between 100 mm and 120 mm; and
providing a value of less than 50 μm for the axial cavity dimension of the first cavity.

14. The method according to claim 13, which further comprises setting the value for the seed diameter to be 110 mm.

15. The method according to claim 13, which further comprises setting the growth region diameter for the crystal growth region to be 110 mm.

16. The method according to claim 2, which further comprises:
providing the seed diameter with a value in a range between 150 mm and 170 mm;
providing the crystal growth region with a growth region diameter having a value in a range between 155 mm and 175 mm; and
providing a value of less than 75 μm for the axial cavity dimension of the first cavity.

17. The method according to claim 16, which further comprises setting the value for the seed diameter to be 160 mm.

18. The method according to claim 16, which further comprises setting the value for the growth region diameter to be 160 mm.

19. The method according to claim 2, which further comprises:
providing the seed diameter with a value in a range between 200 mm and 225 mm;
providing a growth region diameter with a value in a range between 205 mm and 230 mm for the crystal growth region; and
providing a value of less than 100 μm for the axial cavity dimension of the first cavity.

20. The method according to claim 19, which further comprises setting the value for the seed diameter to be 210 mm.

21. The method according to claim 19, which further comprises setting the value for the growth region diameter to be 210 mm.

22. The method according to claim 2, wherein a holder material made of polycrystalline SiC is used for the seed holder.

23. A monocrystalline SiC substrate, comprising:
a substrate main surface;
a central center longitudinal axis oriented perpendicular to said substrate main surface;
a radial edge; and
an SiC crystal structure having lattice planes, said lattice planes at every point have an angle of inclination relative to a direction of said central center longitudinal axis, and peripheral angles of inclination at any desired point at said radial edge differ in terms of amount by less than 0.05° from a central angle of inclination at a site of said central center longitudinal axis.

24. The SiC substrate according to claim 23, wherein said substrate main surface has a substrate diameter of at least 100 mm.

25. The SiC substrate according to claim 23, wherein said substrate main surface has a substrate diameter of at least 150 mm.

26. The SiC substrate according to claim 23, wherein said substrate main surface has a substrate diameter of at least 200 mm.

27. The SiC substrate according to claim 23, wherein said substrate main surface has a substrate diameter of at least 250 mm.

* * * * *